(12) United States Patent
Kuttner

(10) Patent No.: US 6,552,592 B1
(45) Date of Patent: Apr. 22, 2003

(54) DIFFERENTIAL INPUT CIRCUIT FOR DIGITAL SIGNAL PROCESSING SYSTEM

(75) Inventor: Franz Kuttner, Ulrich (AT)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/786,536

(22) PCT Filed: Sep. 1, 1999

(86) PCT No.: PCT/DE99/02757

§ 371 (c)(1),
(2), (4) Date: Jul. 26, 2001

(87) PCT Pub. No.: WO00/14883

PCT Pub. Date: Mar. 16, 2000

(30) Foreign Application Priority Data

Sep. 4, 1998  (DE) .......................................... 198 40 443

(51) Int. Cl.[7] ................................................. H03L 5/00
(52) U.S. Cl. ......................... 327/307; 327/332; 327/306
(58) Field of Search ................................. 327/306, 307, 327/331, 332, 311, 552

(56) References Cited

U.S. PATENT DOCUMENTS 3,700,871 A * 10/1972 Montgomery, Jr. et al. .................... 340/347 AD
5,873,838 A * 2/1999 Mogi .......................... 600/509

FOREIGN PATENT DOCUMENTS

| EP | 0 178 044 A2 | 4/1986 |
| EP | 0 539 259 A1 | 4/1993 |
| EP | 0 714 169 A1 | 5/1996 |
| EP | 0 539 259 B1 | 11/1996 |

OTHER PUBLICATIONS

Patent Abstracts of Japan, vol. 017, No. 359 (E–1395), Jul. 7, 1993, JP 05 055918 A, Mar. 5, 1993.

* cited by examiner

Primary Examiner—Dinh T. Le
(74) Attorney, Agent, or Firm—Samuels, Gauthier & Stevens, LLP

(57) ABSTRACT

The invention relates to an evaluation device (4) connected to the output of an A/D converter (3) for comparing the direct component of a digitally converted input signal having a threshold value and at least one power source (13, 14, 17, 18) that may be connected to the differential input (1) by the evaluation device (4) in such a way that the differential input (1) can be loaded or unloaded with a current to increase or reduce the direct component in the direction of the threshold value.

17 Claims, 2 Drawing Sheets

DIFFERENTIAL INPUT CIRCUIT FOR DIGITAL SIGNAL PROCESSING SYSTEM

BACKGROUND OF THE INVENTION

The present invention relates to the field of differential input circuits, and in particular to a differential input circuit for a digital signal processing system that includes an analog difference input and an analog/digital converter, as well as a device for adjusting the DC component in a digitally converted input signal.

Digital signal processing systems are widespread. As known, these systems are technically and economically superior to analog circuits in numerous ways, and are replacing analog circuits in many applications.

In many cases signals are transmitted as analog signals due to the limited bandwidth available in the transmission medium. Consequently, an analog/digital converter (A/D converter) must be connected before the digital signal processing system. To improve noise immunity, input circuits with a difference input are frequently used for this purpose, with the input signal frequently being fed into the A/D converter through an anti-aliasing filter.

However, transmitting signals with the usual modulation methods has the consequence that the received signal does not have a DC component (signal component at frequency zero). Since such a DC component is important for several signals, for example video signals with a porch, this must be specially reconstructed by using information transmitted together with the signal.

Differential input circuits for this purpose are known, in which a DC component of the signal can be recovered and adjusted by resistors and capacitors. However, a disadvantage of these circuits is that, if the resistors are mismatched or if there is an offset in a subsequent anti-aliasing filter and/or the A/D converter, the DC component of the digitally converted input signal will be defective ("clamping error"). In case of video signals, this can result in color garbling or, in a black and white picture, it can lead to color tinge.

European Patent Application EP-A-0539259 describes a differential input circuit with an analog-digital converter, and a microprocessor that evaluates the analog input signals converted by the analog-digital converter and performs corrections to attain a design value.

European Patent Application EP 0714169 A1 describes an input circuit with an analog-digital converter and a comparison circuit, which compares the input signal that has been digitally converted by the analog-digital converter to a design value, to adjust the DC component of the analog input signal.

Japanese Patent Application JP 05055918A describes a differential input circuit with an analog difference input for an operational amplifier. An analog-digital converter is connected after the operational amplifier, and it converts the analog output signal of the operational amplifier into a digital value. The digitally converted value is compared with a design value by an evaluation device. To adjust the DC component of the analog input signal, the analog difference input is charged or discharged in the direction toward the design value.

Therefore, there is a need for a differential input circuit that accurately recovers a DC component of a received signal.

SUMMARY OF THE INVENTION

It is an object of the invention to create a differential input circuit of the type mentioned in the introduction, so that the errors in the DC component of an analog transmitted and digitally converted input signal can essentially be avoided.

Briefly, according to an aspect of the present invention, a differential input circuit for a digital signal processing system receives a differential input signal and provides an analog input signal indicative thereof. The circuit digitizes the analog input signal and provides a digital input signal indicative thereof, and compares the DC component of the digital input signal with a DC-component design value. The circuit regulates the magnitude of the analog input signal such that the DC-component of the digital input signal is driven towards the DC-component design value.

An advantage of the inventive input circuit is that, by evaluating the digitally converted input signal, errors caused by an anti-aliasing filter and the A/D converter and possibly other components can be compensated.

Further details, features, and advantages of the invention are apparent from the following description of a preferred embodiment in terms of the drawing.

DETAILED DESCRIPTION OF THE INVENTION

Figure 1:
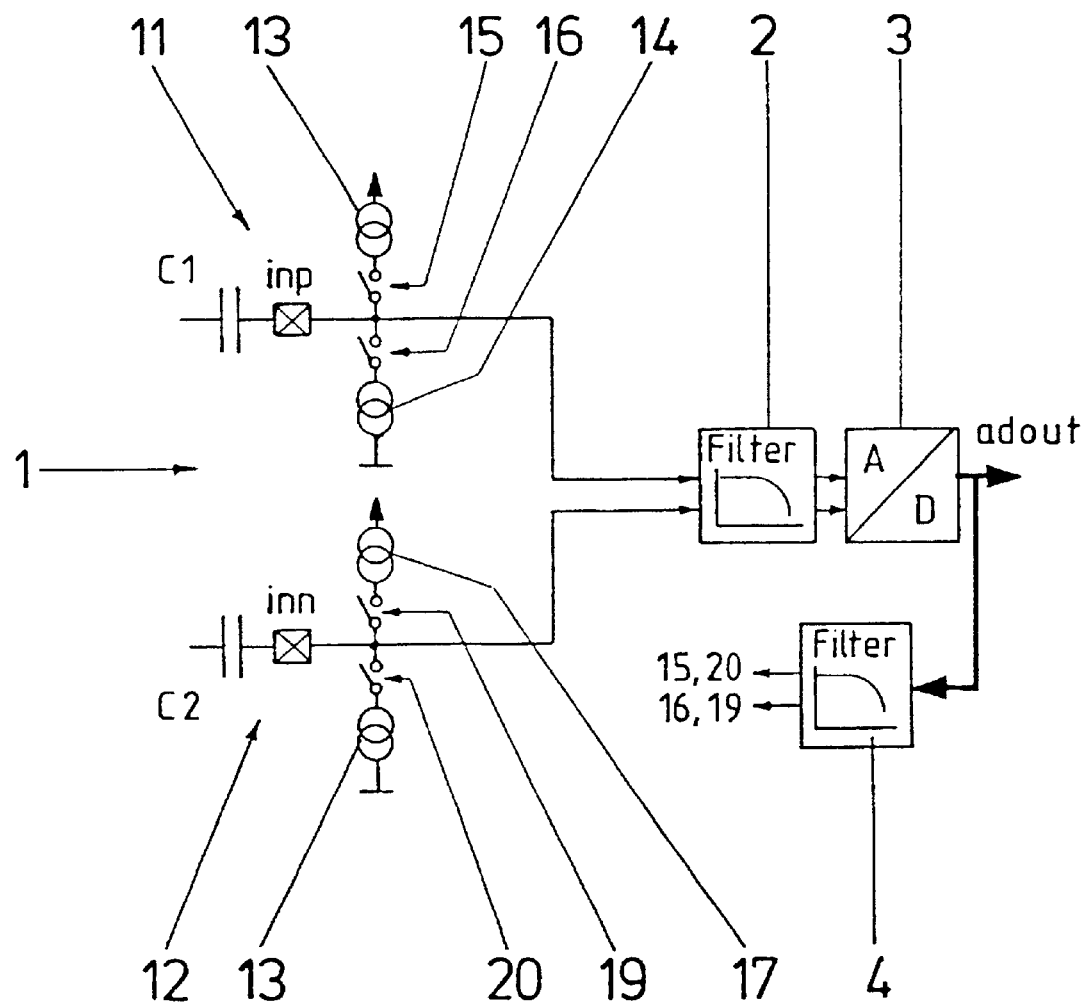
FIG. 1 illustrates a basic circuit diagram of a differential input circuit for a digital signal processing system.

FIG. 1 illustrates a differential input circuit that includes a difference input 1, which is connected to an anti-aliasing filter 2. The outputs of this filter 2 are connected to an A/D converter 3, which provides a digitally converted difference input signal (adout) to a digital signal processing system (not shown) and an evaluation device 4.

The difference input 1 includes a first, non-inverting input connection 11 (inp) and a second, inverting input connection 12 (inn). Each of the input connections 11, 12 is equipped in usual fashion with a capacitor C1, C2 to block DC voltages from a preceding stage.

A first current source 13 is connected between a positive reference potential and the first input connection 11, and a second current source 14 is connected between the first input connection 11 and ground. A first switch 15 is connected between the first current source 13 and the first input connection 11, and a second switch 16 is connected between the first input connection 11 and the second current source 14.

A third current source 17 is situated between the positive reference potential and the second input connection 12, and a fourth current source 18 is connected between the second input connection 12 and ground. Here, too, both current sources 17, 18 are connected to the second input connection 12, through a third and fourth switch 19, 20, respectively.

The basic function of the circuit is to filter and digitize a differential input signal applied to the difference input 1, and provide the digitzed signal to the evaluation device 4. The evaluation device determines whether the DC component of the input signal is greater than or less than a specified threshold, which is determined digitally, for example by evaluating information transmitted together with the input signal. If the DC component is too small, the evaluation device 4 closes the first switch 15 through a suitable switching signal, to charge the first input connection 11 with the first current source 13. Alternatively, the evaluation device 4 can command the fourth switch 20 to close in order to increase the DC component by discharging the second input connection 12. The second and third switches 16, 19 here remain in their opened position.

If the DC component is too high, the first input connection 11 is discharged through the second current source 14 by closing the second switch 16, or the second input terminal 12 is charged through the third current source 17 by closing the third switch 19. The first and the fourth switches 15, 20 here remain in their open state. All the switches are opened or closed by the evaluation device 4 via appropriate switching signals.

The DC level can be tracked slowly. Regulation here can be made immune to noise by a digital filter. The control loop does indeed pull the difference of the analog signals toward the desired value. However, with this arrangement, there is no control circuit for the in-phase signal of the analog inputs.

To regulate the phase commonality, use is therefore made of the fact that the difference signal can be regulated at the first (non-inverting) or at the second (inverting) input connection 11, 12, respectively. Therefore, if the difference is to be increased, this can be accomplished by closing the first switch 15 at the first input connection 11 or by closing the fourth switch 20 at the second input connection 12. The difference can be reduced if the second switch 16 at the first input connection 11 or the third switch 19 at the second input connection 12 is closed. The other switches are open in this control mode.

Figure 2:
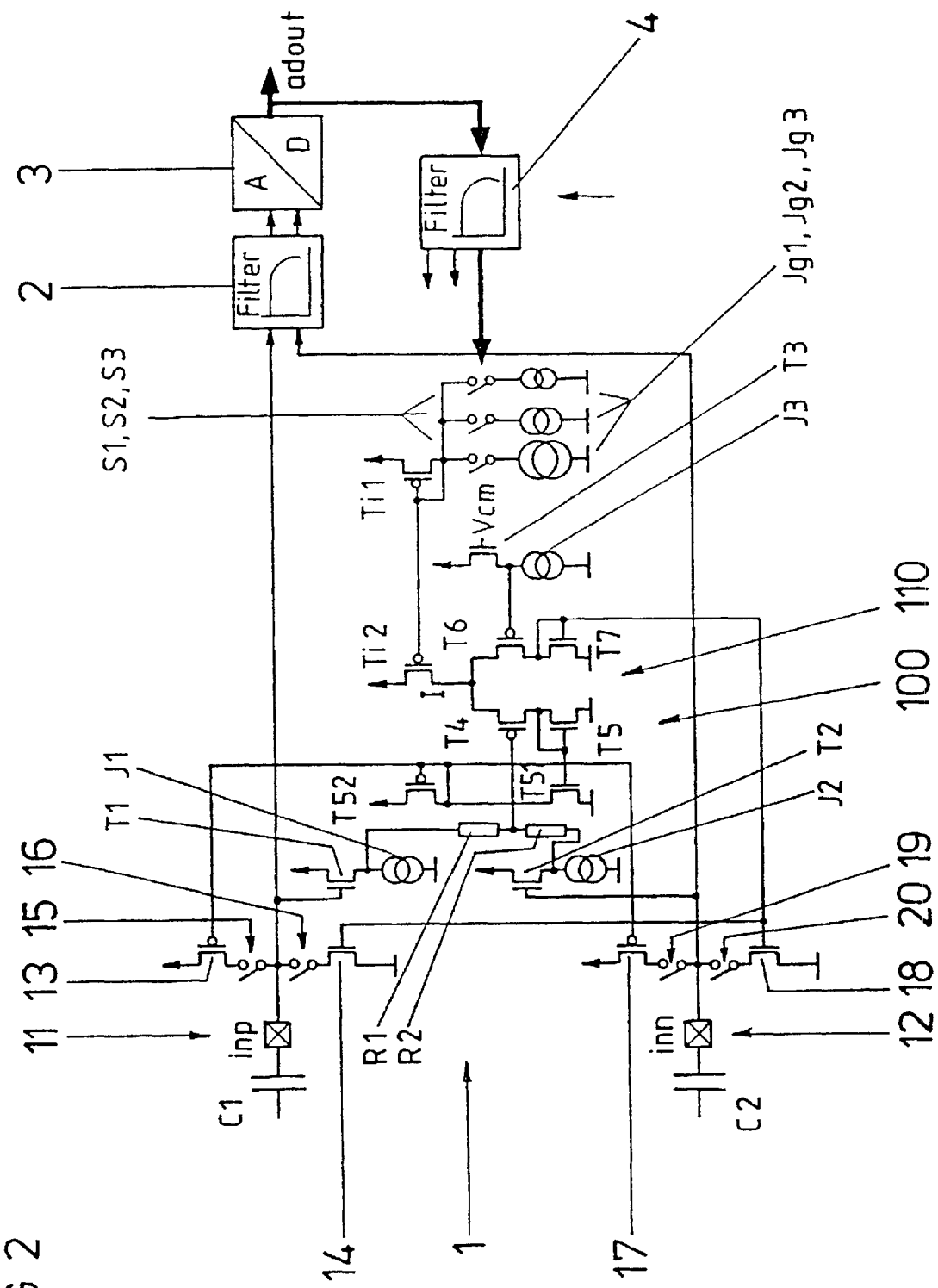
FIG. 2 illustrates a circuit diagram of a preferred embodiment differential input circuit.

FIG. 2 shows a preferred embodiment of the inventive differential input circuit with a common-phase control. The current sources 13, 14, 17, 18 are always designed as a controllable semiconductor element (e.g., especially as field effect transistors), and are actuated via their base or gate connection to adjust the amplitude of the current. Furthermore, the elements shown in FIG. 1 are also found in this circuit and are designated respectively by the same reference symbols. In addition, an actuation circuit 100 for the current sources is present, which contains a difference stage 110.

The in-phase voltage of the input signals and a desired design in-phase voltage Vcm are both conducted to this difference stage 110.

The voltage applied to the first input connection 11 is taken off by a field effect transistor T1, connected as a source follower, with a drain current source I1, as well as a first resistor R1. The voltage applied to the second input connection 12 is conducted through a second field effect transistor T2, connected as a source follower, with a drain current source 12 as well as a second resistor R2. The other ends of the first and second resistors R1, R2 are connected to one side of the difference stage 110. The two source followers are used for decoupling and prevent the analog input voltages from being affected by the resistors R1, R2.

The other side of the difference stage 110 carries the desired in-phase voltage Vcm, which is conducted through a third field effect transistor T3, connected as a source follower, with drain current source 13.

The two sides of the difference stage 110 are formed by the series-connected transistors T4, T5 and T6, T7, respectively. The in-phase voltages are applied respectively to the gate connections of the fourth and sixth transistors T4, T6. The fifth transistor T5 is connected, via transistors, T51, T52, to the control terminals of the first and third current sources 13, 15, and the sixth transistor T6 is connected to the control connections of the second and fourth current sources 14, 16.

Three parallel-connected current sources Ig1, Ig2, Ig3 are connected in series with the current source switches S1, S2, S3, respectively. Depending on the level of the current to be fed into the difference input, these switches are closed or opened by the evaluation device 4. For this purpose, the current sources are connected, via two further transistors Ti1, Ti2, to the connection point of the fourth and sixth transistors T4, T6.

Since all three source followers (transistors T1, T2, T3) are identical, the difference stage 110 evaluates only the difference between the in-phase voltage at the input connections and the desired in-phase voltage Vcm. The difference stage 100 distributes the current fed into its base in such a fashion that, depending on the deviation of the in-phase voltage of the input signal from the desired in-phase voltage, every readjustment of the difference value readjusts the in-phase voltage in the proper direction, by closing the first and fourth, or the second and third switches, 15, 20; 16, 19 respectively.

To ensure the in-phase voltage of the digitally converted input signal is equalized to the desired In-phase voltage Vcm as quickly as possible, the evaluation device 4 not only determines the direction in which the In-phase voltage is to be changed, but also the magnitude of the difference between the two voltages. Depending on the magnitude of this difference, the clamping current, in the case of large deviations, is made as large as possible through a control output Si of the evaluation device 4, which appropriately closes the current source switches S1, S2, S3. Especially upon turn-on, this causes a rapid decay of initial transients to the desired value.

The circuit can be used both for continuous clamping (the regulation process is always active), and also for cycled clamping, for example in the case of video signals, in which the DC component is present as an information signal only at certain times. For this purpose, a clamping switching signal Sk can be conducted to the evaluation device 4, so this device is switched active only at the clamping instants.

What is claimed is:

1. A differential input circuit for a digital signal processing system, said differential input circuit comprising:

a low pass filter that receives a compensated differential input signal, and provides a filtered differential input signal;

an analog-to-digital converter that receives said filtered differential input signal, and provides a digitized signal indicative of the difference between inverting and non-inverting signal components of said filtered differential input signal;

an evaluation unit that receives said digitized signal, and compares said digitized signal against a threshold value, and provides an output signal indicative of the difference between said digitized signal and said predetermined threshold value; and means, responsive to said output signal and an analog differential input signal having analog inverting and non-inverting signal components, for adjusting the voltage difference between said analog inverting and non-inverting signal components in response to said output signal using a plurality of switched current sources, to provide said compensated differential input signal.

2. The input circuit of claim 1, wherein the switched current sources are formed by controllable semiconductor elements, to compare an in-phase design voltage with an in-phase voltage of the analog input signal, in such a fashion that, in dependence on the difference between the in-phase voltage and the design in-phase voltage, the in-phase voltage is adjusted every time one of the switches is activated.

3. The input circuit of claim 2, wherein said means for adjusting the voltage difference has a non-inverting input connection and an inverting input connection, with a first and second current source being associated with the non-inverting input connection and a third and fourth current source being associated with the inverting input connection, such that said current sources can be switched to a difference input by the evaluation unit activating the associated switch, so as to respectively charge or discharge the difference input.

4. The input circuit of claim 3, wherein the first current source is connected between a positive reference potential and the non-inverting input connection, the second current source is connected between a ground potential and the non-inverting input connection, the third current source is connected between a positive reference potential and the inverting input connection, and the fourth current source is connected between ground potential and the inverting input connection.

5. The input circuit of claim 1, wherein the evaluation unit has at least one low-pass filter.

6. A differential input circuit for a digital signal processing system, comprising:

means, for receiving and low pass filtering a differential input signal, and for providing a filtered analog differential input signal indicative thereof having inverting and non-inverting signal components;

means for digitizing said filtered analog differential input signal, and for providing a digital input signal indicative of the difference between said inverting and non-inverting signal components; and means, responsive to said digital input signal, for comparing said digital input signal against a threshold value, and for providing at least one command signal to said means for receiving to regulate the difference between said inverting and non-inverting signal components such that said digital input signal is driven towards said threshold value, wherein said means for receiving comprises a plurality of switched current sources responsive to said at least one command signal, to control the voltage difference between said inverting and non-inverting signal components.

7. The differential input circuit of claim 6, wherein said plurality of current sources comprises:

a first current source, responsive to said at least one command signal, and configured and arranged to increase the difference between said inverting and non-inverting signal components; and a second current source, responsive to said at least one command signal, and configured and arranged to decrease the difference between said inverting and non-inverting signal components .

8. The differential input circuit of claim 7, wherein said means for receiving and low pass filtering a differential input signal, comprises:

a first input circuit that receives a first input signal of said differential input signal, and includes a first low pass filter that provides said inverting signal component; and a second input circuit that receives a second input signal of said differential input signal, and includes a second low pass filter that provides said non-inverting signal component.

9. The differential input circuit of claim 6, wherein said differential input circuit is formed as an integrated circuit device.

10. A differential input circuit, comprising:

a plurality of switched current sources responsive to a differential input signal and at least one command signal, to control the voltage difference between inverting and non-inverting signal components and provide a compensated differential input signal;

means, for receiving and low pass filtering said compensated differential input signal, and for providing a filtered analog differential input signal indicative thereof having filtered inverting and non-inverting signal components;

means for digitizing said filtered analog differential input signal, and for providing a digital input signal indicative of the difference between said filtered inverting and non-inverting signal components; and means, responsive to said digital input signal, for comparing said digital input signal against a threshold value, and for providing said at least one command signal to regulate the difference between said inverting and non-inverting signal components such that said digital input signal is driven towards said threshold value.

11. The differential input circuit of claim 10, wherein said means for digitizing comprises at least one analog-to-digital converter.

12. The differential input circuit of claim 11, wherein said plurality of current sources comprises:

a first current source, responsive to said at least one command signal, and configured and arranged to increase the difference between said inverting and non-inverting signal components; and a second current source, responsive to said at least one command signal, and configured and arranged to decrease the difference between said inverting and non-inverting signal components.

13. The differential input circuit of claim 11, wherein said plurality of current sources comprises:

a first current source, responsive to said at least one command signal, and configured and arranged between a first voltage potential and said non-inverting signal component;

a second current source, responsive to said at least one command signal, and configured and arranged between said non-inverting signal component and a second voltage potential;

a third current source, responsive to said at least one command signal, and configured and arranged between said first voltage potential and said inverting signal component; and a fourth current source, responsive to said at least one command signal, and configured and arranged between said inverting signal component and said second voltage potential.

14. The differential input circuit of claim 11, wherein said plurality of current sources comprises:

a first current source, responsive to said at least one command signal, and configured and arranged between a first voltage potential and said non-inverting signal component; and a second current source, responsive to said at least one command signal, and configured and arranged between said non-inverting signal component and a second voltage potential.

15. The differential input circuit of claim 11, wherein said plurality of current sources comprises:

a first current source, responsive to said at least one command signal, and configured and arranged between said first voltage potential and said inverting signal component; and a second current source, responsive to said at least one command signal, and configured and arranged between said inverting signal component and said second voltage potential.

16. The differential input circuit of claim 11, wherein each of said plurality of current sources comprises at least one field effect transistor.

17. The differential input circuit of claim 11, wherein each of said plurality of current sources comprises at least one transistor.

* * * * *